United States Patent
Zalevsky et al.

(10) Patent No.: US 9,437,006 B2
(45) Date of Patent: *Sep. 6, 2016

(54) METHOD AND SYSTEM FOR OBJECT RECONSTRUCTION

(71) Applicant: Apple Inc., Cupertino, CA (US)

(72) Inventors: Zeev Zalevsky, Rosh HaAyin (IL); Alexander Shpunt, Tel Aviv (IL); Aviad Maizels, Tel Aviv (IL); Javier Garcia, Valencia (ES)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/745,438

(22) Filed: Jun. 21, 2015

(65) Prior Publication Data

US 2015/0287205 A1    Oct. 8, 2015

Related U.S. Application Data

(63) Continuation of application No. 13/763,738, filed on Feb. 11, 2013, now Pat. No. 9,066,084, which is a continuation of application No. 11/991,994, filed as application No. PCT/IL2006/000335 on Mar. 14, 2006, now Pat. No. 8,400,494.

(60) Provisional application No. 60/724,903, filed on Oct. 11, 2005.

(51) Int. Cl.
*H04N 13/02* (2006.01)
*G06T 7/00* (2006.01)
*G01B 11/16* (2006.01)
*G01B 11/25* (2006.01)

(52) U.S. Cl.
CPC .......... *G06T 7/0057* (2013.01); *G01B 11/162* (2013.01); *G01B 11/2513* (2013.01); *H04N 13/02* (2013.01)

(58) Field of Classification Search
CPC ........... G01B 11/162; G01B 11/2513; G06T 7/0057; H04N 13/02
See application file for complete search history.

(56) References Cited

PUBLICATIONS

Chen et al., "A solution of correspondence problems for measuring 3D surface", IEEE International Conference on Acoustics, Speech, and Signal Processing (ICASSP), pp. IV-3553-IV-3556, May 13-17, 2002.
Batlle J et al., "Recent progress in coded structured light as a technique to solve the correspondence problem: a survey", Pattern Recognition, vol. 31, Issue 7, pp. 963-982, Jul. 31, 1998.
European Application # 06711317.5 Search Report dated Dec. 22, 2015.

*Primary Examiner* — Larry Donaghue
(74) *Attorney, Agent, or Firm* — D. Kligler IP Services LTD.

(57) ABSTRACT

A system and method are presented for use in the object reconstruction. The system comprises an illuminating unit, and an imaging unit (see FIG. 1). The illuminating unit comprises a coherent light source and a generator of a random speckle pattern accommodated in the optical path of illuminating light propagating from the light source towards an object, thereby projecting onto the object a coherent random speckle pattern. The imaging unit is configured for detecting a light response of an illuminated region and generating image data. The image data is indicative of the object with the projected speckles pattern and thus indicative of a shift of the pattern in the image of the object relative to a reference image of said pattern. This enables real-time reconstruction of a three-dimensional map of the object.

14 Claims, 6 Drawing Sheets

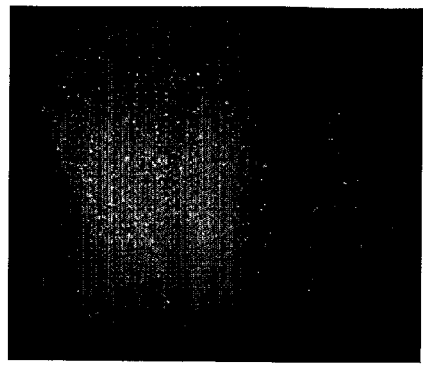
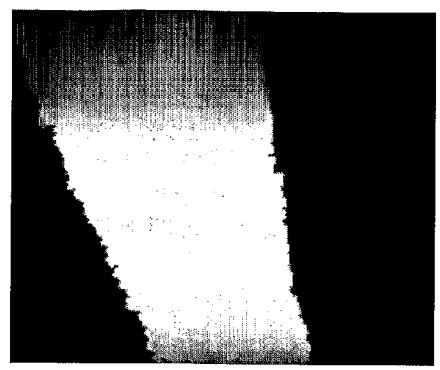
FIG. 4C
FIG. 4D
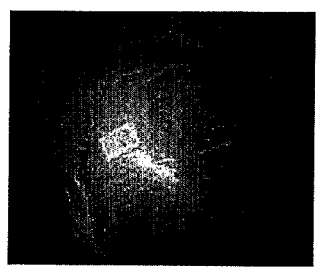
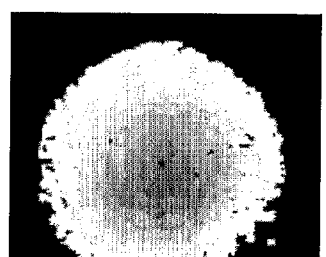
FIG. 4E
FIG. 4F
FIG. 4G
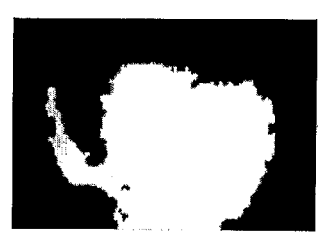
FIG. 4H
FIG. 4I
FIG. 4J

METHOD AND SYSTEM FOR OBJECT RECONSTRUCTION

REFERENCE TO CROSS-RELATED APPLICATIONS

This application is a continuation of U.S. patent application Ser. No. 13/763,738, filed Feb. 11, 2013, which is a continuation of U.S. patent Ser. No. 11/991,994 (now U.S. Pat. No. 8,400,494), filed Mar. 25, 2010, in the national phase of PCT Patent Application PCT/IL2006/000335, filed Mar. 14, 2006, which claims priority from U.S. provisional application No. 60/724,903, filed Oct. 11, 2005, herein incorporated by reference in its entirety.

FIELD OF THE INVENTION

This invention relates to a method and system for object reconstruction, enabling to extract highly resolved and real-time 3-D information.

REFERENCES

The following references are considered to be pertinent for the purpose of understanding the background of the present invention:
1. S. Avidan and A. Shashua, "Trajectory triangulation: 3D reconstruction of moving points from amonocular image sequence," PAMI, 22, 348-357 (2000).
2. Y. G. Leclerc and A. F. Bobick, "The direct computation of height from shading," CVPR, 552-558 (1991).
3. R. Zhang and M. Shah, "Shape from intensity gradient," SMC-A, 29, 318 (1999).
4. R. Zhang and M. Shah, "Height recovery from intensity gradients," CVPR, 508-513 (1994).
5. B. K. P. Horn, "Height and gradient from shading," IJCV, 5, 37-76 (1990).
6. A. M. Bruckstein, "On shape from shading," CVGIP, 44, 139-154 (1988).
7. L. Zhang, B. Curless and S. M. Seitz, "Rapid shape acquisition using color structured light and multi pass dynamic programming," 1st International Symposium on 3D data processing visualization and transmission (3DPVT), July 2002, Padova, Italy.
8. P. Besl, "Active optical range imaging sensors," Machine vision and applications, 1, 127-152 (1988).
9. E. Horn and N. Kiryati, "Toward optimal structured light patterns," Proc. Int. Conf. On Recent advances in 3-D Digital Imaging and Modeling, 28-37, Ottawa Canada, May 1997.
10. M. Asada, H. Ichikawa, S. Tjuji, "Determining of Surface Properties by Projecting a Stripe Pattern," IEEE Proc. of ICPR, 86 (1986).
11. M. Asada, H. Ichikawa, S. Tsuji "Determining Surface Orientation by Projecting a Stripe Pattern," IEEE Transact. on PAMI, vol. 10, no. 5 (1988).
12. S. Winkelbach and F. M. Wahl "Shape from Single Stripe Pattern Illumination," Luc Van Gool (Editor), (DAGM 2002) Pattern Recognition, Lecture Notes in Computer Science 2449, Springer 2002, page 240-247.
13. T. P. Koninckx and L. Van Gool "Efficient, Active 3D Acquisition, Based on a Pattern-Specific Snake," Luc Van Gool (Editor), (DAGM 2002) Pattern Recognition, Lecture Notes in Computer Science 2449, Springer 2002, page 557-565.
14. R. Kimmel, N. Kiryati, and A. M. Bruckstein, "Analyzing and synthesizing images by evolving curves with the Osher-Sethian method," International Journal of Computer Vision, 24(1), 37-56 (1997); G. Zigelman, R. Kimmel, and N. Kiryati, "Texture mapping using surface flattening via multi-dimensional scaling," IEEE Trans. on Visualization and Computer Graphics, 8 (2), 198-207 (2002).
15. J. C. Dainty, Laser Speckle and Related Phenomena, $2^{nd}$ ed. (Springer-Verlag, Berlin, 1989).
16. D. Mendlovic, Z. Zalevsky, I. Kiryuschev and G. Lebreton, "Composite harmonic filters for scale, projection and shift invariant pattern recognition," Appl. Opt. 34, 310-316 (1995).

BACKGROUND OF THE INVENTION

The object reconstruction is typically based on estimating the 3-D texture of an object (i.e., 3-D map). Various techniques have been developed in this field.

One of the approaches deals with triangulation [1] utilizing two cameras observing the same object. A relative shift of the same items in the images acquired by the cameras, respectively, is related to a distance to these items. This technique is similar to 3-D estimation in human vision system. The main disadvantage of this approach is its low 3-D resolution, which strongly depends on a number of pixels in both cameras, the detail (e.g. texture) present on the scene, and a relative orientation of the cameras (angle and distance between them). Moreover, this approach does not provide for real-time mapping of objects because the extraction of 3-D information requires high level processing operations such as classification and registration. An additional problem with this approach is that 3D information obtained usually contains only relatively sparse samples of object depth.

Another known technique of the kind specified utilizes numerical algorithms based on the use of shadows of edges in the single captured image in order to compute the 3-D map of an object [2-6]. This technique, however, requires high level processing, and is inaccurate since the shadow of edges is the noisiest region of the image. Furthermore, this approach accumulates errors, since the first shadow is sued as a reference for the computation in the entire image.

Yet another approach for 3-D estimation is based on projection of patterns. Some techniques based on this approach utilize projection of a line onto an object and scanning the object with this line. A curvature generated in the line image is indicative of the 3-D map of the object. This technique, however, does not provide a real time process of the object reconstruction; it takes time to scan the object with the line; and the estimation becomes more distorted in case the object moves.

Some other techniques of this type utilize projection of special codes [7-9]. The code variation in an acquired image allows for computing the 3-D map of the object. These techniques are also not real-time since several projections are required. In addition, in order to obtain good 3-D resolution very large and complicated codes are required; this makes a projection system very expensive and not practical.

Yet other techniques based on the projection of patterns include single projection of a 2-D periodic pattern [10-14]. In this case, 3-D details of the object shift the lines of the periodic pattern in the captured image. A relative shift of these lines is related to the 3-D information of the object. Although with these techniques scanning is not required and the 3-D information can be obtained in real time, these technique suffer from the fact that 3-D information is wrapped since relative movements larger than the period of the projected pattern cannot be distinguished, and thus one cannot identify whether the obtained shift is that to be taken as is or an integer multiplied by the period size is to be added. Another disadvantage of this approach is associated with the depth of focus of the projected pattern. After a certain distance, the pattern is defocused, and it is very hard to extract numerically the relative shift of the periods.

SUMMARY OF THE INVENTION

There is accordingly a need in the art to facilitate the object reconstruction, by providing a novel technique allowing a real-time and very accurate mapping of 3-D objects, which can be achieved with a very simple and inexpensive optical set up.

The present invention provides such a mapping technique, which can advantageously be used to provide data input to a Man Machine Interface, e.g., for gaming, fitness, etc.; 3D capability for bio-medical applications (such as endoscopy), cameras in cellular devices, range estimation between vehicles and proximity alarm, intrusion alarm, etc.

Here, the term "object reconstruction" refers to the acquisition of the 3-D information of any part or whole of the object outer surfaces, possibly including construction of a 3-D object model (including the object shape model), from an image, range or other sensed data; the term "real-time" refers to an operation for which the combined reaction- and operation-time of a task is shorter than the maximum delay that is allowed, in view of circumstances outside the operation.

The terms camera, imaging unit, and imaging device are used interchangeably, all referring to the same function of detecting light and generating image data indicative thereof. The terms projector, projecting system and illumination unit are also used interchangeably.

The main idea of the present invention consists of utilizing projection of a laser random speckle pattern onto an object the 3D surface data of which is to be reconstructed. Laser speckles are random self-generated patterns [15]. Preferably, the pattern is constant, but generally may be partitioned or other type varying along the Z axis (i.e. along the axis of speckle propagation). The term "constant speckle pattern" used herein signifies that the pattern is substantially not varying along the Z-axis within the region in which 3D measurements are to be taken. In addition, the depth of focus of such pattern is relatively large, e.g., order of several meters, or as required by a specific application, being controlled by changing the laser spot size on the diffuser and the laser wavelength. Hence, the use of a laser random pattern provides a large longitudinal range which can be mapped, and allows for significantly reducing both the optical complexity in designing a projection system and that of the post-processing, thus allowing for the real-time object reconstruction.

Generally, in optical systems, a speckle pattern is a field-intensity pattern produced by the mutual local interference of partially coherent beams.

According to the invented approach, the 3-D map of an object is estimated by examining a relative shift of a laser random pattern (code). This pattern is not periodic, and thus the wrapping problem does not exist, thus allowing for both the determination of a range from a reference plane and the 3-D mapping of the object. Since the laser pattern is less dependent on defocusing, 3-D information can be obtained over a large volume.

An optical set up (projection module) can be very simple and cheap: it can include only a small coherent light source (laser) and a pattern generator in the form of a light diffuser (e.g., piece of ground glass that diffuses light impinging thereon by addition of random phase), or e.g. in the form of a holographically recorded, randomized surface relief structure, which is accommodated in the optical path of laser light and scatters this light in the form of constant and random speckle pattern onto the object. It is important to note that the invention allows for acquiring only a single image of the object with a projected random pattern (the so-called single-snapshot solution) and for using a simple image matching algorithm, e.g. a correlation based image processing algorithm, which is thus of low computational complexity. Also, it is important to note that the invention, even when utilizing more than one images, allows for operation with a single stationary mounted camera (generally, with the single field of view). These properties allow real time realization of the 3-D mapping.

It should be understood that according to the invention the so-called "primary speckles" are considered namely those projected onto the object to be mapped, and not "secondary speckles" which are typically those associated with the surface roughness of the object and/or aperture of an imaging lens. Accordingly, an imaging lens may be small.

Thus, according to one broad aspect of the invention, there is provided a system for use in the object reconstruction, the system comprising: an illuminating unit comprising a coherent light source and a generator of a random speckle pattern (e.g. diffuser unit) accommodated in the optical path of illuminating light propagating from the light source towards an object thus projecting onto the object a coherent random speckle pattern; and an imaging unit for detecting a light response of an illuminated region and generating image data, the image data being indicative of the object with the projected speckles pattern and thus indicative of a shift of the pattern in the image of the object relative to a reference image of said pattern, the system thereby enabling real-time reconstruction of a three-dimensional map of the object.

Preferably, the system includes a control unit configured for storing reference data indicative of a reference image of the speckle pattern. The reference data is preferably indicative of the image of the speckle pattern acquired at a reference plane oriented substantially normally to the optical path of illuminating light propagation and at a substantially the same distance from the diffuser and the imaging unit. The control unit is preprogrammed for processing and analyzing the image data utilizing the reference data for determining correlation between the object and reference images. The control unit may be preprogrammed for decomposing the data indicative of the image into Mellin and/or logarithmic decompositions, thereby obtaining the correlation which is invariant to scaling and projection distortion of the speckle patterns.

The system is configured to define a measured volume formed by intersection between the illuminating light propagation and the light collection of the imaging unit such as to provide for imaging the object distanced from the diffuser unit a distance larger than a Rayleigh distance. Each point in said measured volume defines an angle of intersection between the illuminating and collected light propagation paths. Considering the triangulation technique, this is a certain non-zero angle selected to provide appropriate accuracy of triangulation.

Preferably, the system configuration is such that an average speckle feature size, $\Delta x_{cam}$, on a pixel plane of the imaging unit is at least two pixels.

Preferably, the diffuser unit and the imaging unit are oriented so as to provide substantially equal distances from the diffuser and the imaging unit to the object. In this case, the average speckle feature size, $\Delta x_{cam}$, on the pixel plane of the imaging unit can be determined as:

$$\Delta x_{cam} = \frac{F}{\phi_D}\lambda,$$

wherein F is the focal length of an imaging lens; $\phi_D$ is the illuminating spot size on the diffuser; and $\lambda$ is the wavelength of the illuminating light.

The matching algorithm allows for a predetermined variability in the average speckle feature size $\Delta x_{cam}$, i.e. the control unit is preprogrammed for processing and analyzing of image portions/images of different average speckle feature sizes $\Delta x_{cam}$, while $\Delta x_{cam}$ is within some predetermined limits. Since $\Delta x_{cam}$ is different for speckle pattern portions reflected from different portions of the object (the scaling of $\Delta x_{cam}$ is given by formulas (9a)-(9d) below), the region in which imaging of the object will lead to meaningful results is determined.

Preferably, the diffuser unit and the imaging unit are located one close to another, within a fraction s (e.g. 20%) of the Rayleigh distance.

Preferably, the system includes an adjustor configured for reducing the illumination brightness variation between different regions of the field of view of the imaging unit. Such adjustor may include a diffractive optical element. The latter may be incorporated within or attached to the diffuser, or located in the optical path of illuminating light propagating towards the diffuser. The diffractive optical element operates together with the diffuser to adjust the brightness within a plane transversal to the optical path of illuminating light propagation.

In some configurations, the adjustor may be controlled to adjust illumination intensity to partially cancel/smooth the effect of the mapped objects on the brightness level received at the imaging unit, e.g. the effects being due to differences in reflection coefficient (albedo), distance, and surface properties. Such an adjustor may receive inputs from the imaging/control unit, and the intensity distribution to be projected in the plane transversal to the optical path of illuminating light propagation.

According to another example, the diffractive optical element may be configured to enable reduction of the brightness variability along an axis substantially parallel to the illuminating light propagation. The diffractive optical element may be a phase only element accommodated downstream of the diffuser with respect to the illuminating light propagation.

The illuminating unit may be configured as a 4-F Fourier Transformer. In this case, the light field in the far field will be a convolution between the far field distribution of the initially projected pattern and the Fourier Transform of the diffractive optical element, accommodated between two converging lenses. For example, a diffractive optical element is used which is configured as a phase only element such that its Fourier transform produces an elliptic cross section of intensity and is accommodated between two converging lenses.

Preferably, the imaging unit includes a single light detector defining a stationary field of view.

According to another broad aspect of the invention, there is provided a method for use in real-time reconstruction of an object, the method comprising: projecting onto the object a random speckle pattern formed by illuminating coherent light; detecting a light response from the object and generating image data of the object with the projected speckles pattern; processing the image data to determine a shift of the pattern in the image of the object relative to a reference image of said pattern, thereby determining a three-dimensional map of the object.

BRIEF DESCRIPTION OF THE DRAWINGS

In order to understand the invention and to see how it may be carried out in practice, preferred embodiments will now be described, by way of non-limiting examples only, with reference to the accompanying drawings, in which:

FIG. 3A shows a reference image (e.g., the projected speckles pattern), and FIG. 3B shows the 3-D reconstruction;

FIGS. 4A to 4J show some more experimental results: FIGS. 4A-4B illustrate projection and mapping of a hand, FIGS. 4C-4D illustrate projection and mapping of a tilted plane, FIGS. 4E-4G show projection and mapping of a basket ball, and FIGS. 4H-4J show projection and mapping of an elephant toy;

DETAILED DESCRIPTION OF EXEMPLARY EMBODIMENTS

Figure 1:
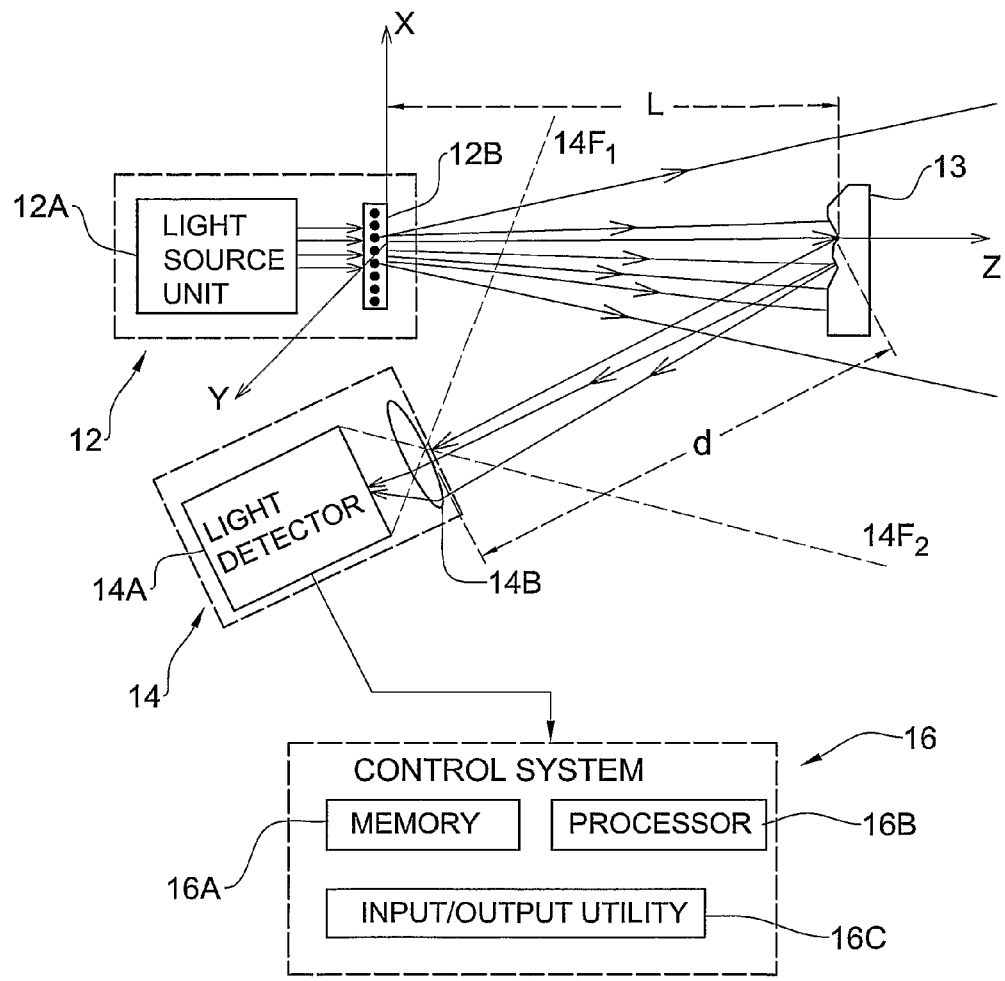
FIG. 1 is a schematic illustration of an example of an optical system of the present invention for reconstructing 3-D objects.

Referring to FIG. 1, there is schematically illustrated an example of a system 10 of the present invention for use in 3-D mapping of objects. System 10 is an optical mapping system including an illuminating unit 12 configured to project a random speckle pattern (preferably constant pattern) onto an object 13; and an imaging device 14.

Illuminating unit 12 includes a coherent light source 12A, and a generator 12B of a constant random speckle pattern accommodated in the optical path of illuminating light, preferably very close (e.g., up to a physical contact) to the light source output. Light source 12A may be constituted by a light emitting assembly (laser) and/or by a light guiding arrangement (e.g., optical fiber) associated with a remote light emitting assembly. Pattern generator 12B is a light diffuser, for example a ground glass.

Imaging device 14 includes alight detector 14A (a pixel matrix, e.g., CCD) equipped with an imaging lens arrangement 14B. The latter may be an integral part of the light detector or a separate unit in front of the detector. Preferably, light reflection from the object is detected.

A control system 16, which may or may not be a constructional part of system 10, is provided being connectable (via wires or wireless signal transmission) to the output of the imaging device. Control system 16 is typically a computer system having inter alia a memory utility 16A, a data processing and analyzing utility 16B, and an input/output utility 16C (e.g. a data presentation utility, such as a display).

The device of the present invention may be associated with or include a mobile phone device. For example, the imaging unit may be incorporated in the mobile phone or its output may be connectable to the mobile phone or other portable computer device. Also, the invention provides for using the 3D capability for range estimation between vehicles and proximity alarm, as well as for intrusion alarm.

As indicated above, speckles are random patterns generated due to local interference of scattered light. The brighter spots are positioned where light was scattered in phase, and the dark positions are where light was in anti phase. According to the embodiment of the invention, the projected speckle pattern is constant in the Z direction (axial axis, passing through the object), that is the pattern does not vary along the Z-axis. It should, however, be understood that the pattern scale does vary along the Z-axis, namely images of the pattern taken at different image planes would be of different scales. An illuminated 3-D object performs a shift of the features of a random pattern in the transversal plane (detection plane). Since the pattern is very random, no wrapping problem exists.

Figure 2:
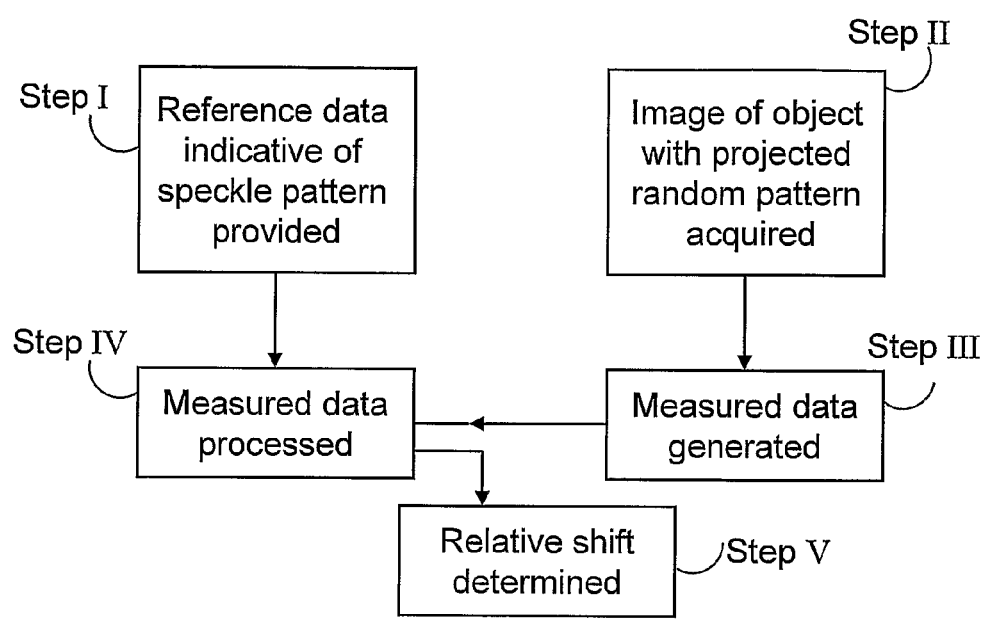
FIG. 2 is a flow diagram of the main steps in a method of the present invention.

Reference is made to FIG. 2 illustrating the main steps in the method of the present invention.

Reference data indicative of the image of a speckle pattern (i.e., image of the pattern with no object) is provided and stored in the memory utility of control system 16 (step I). To this end, the speckle pattern may be projected onto a certain region (where an object to be mapped will then be placed) and the reference image of the speckle pattern is acquired. This reference image may be captured only once.

An image of the object (single image), while located in said region, is acquired (step II) and measured data indicative thereof is generated (step III). To this end, the object is illuminated by light carrying the speckle pattern, and a light response (reflection) from the object is collected by the imaging lens and detected by the light detector. It should be noted that the present invention provides for operating with the single image data, thus significantly reducing the complexity of image processing to reconstruct the 3-D map of an object.

The measured data is processed using the reference data (step IV) to determine a relative shift of the features of the random pattern in the image of the object relative to the pattern in the reference image (step V). This is implemented using a suitable matching (e.g. correlation) algorithm. The latter can be based on a small moving window scanning the captured image and correlating it to the reference image. The correlation peak indicates the relative shift which is related to the 3-D information.

The correlation computation has relatively low complexity and may for example be based on the Fast Fourier Transform (FFT). In addition, since the projected pattern is scaled proportionally to a distance between the projector (laser) and the object, the correlation should be scale and projection invariant. This can be obtained using harmonic decomposition and/or a proper coordinate transformation applied over the reference image before starting correlation [16].

An important parameter is the transversal speckle size (i.e. an average speckle size in the transversal plane):

$$\Delta x = \frac{L}{\phi_D}\lambda, \quad (1)$$

wherein L is a distance between diffuser 12B and object 13, $\lambda$ is the illuminating wavelength, and $\phi_D$ is the illuminated size of the diffuser 12B. The average speckle feature size is one of the factors determining the 3-D resolution. According to equation (1), this size can be controlled by changing the diameter $\phi_D$ of the laser spot at the diffuser and/or laser wavelength $\lambda$.

An axial size $\Delta z$ of the speckle pattern is:

$$\Delta z = \left(\frac{L}{\phi_D}\right)^2 \lambda \quad (2)$$

Matching the speckle transversal shifts relative to the reference plane is easier for objects with faces close to parallel to the transversal plane of the speckle pattern projection (close to normal to the light propagation path). Therefore, in a preferred configuration, the transversal plane of the speckle pattern propagation is projected onto an object. In other words, the light incidence onto the object is preferably close to normal (for the majority of illuminated regions.

Generally, two speckle patterns could appear on the CCD: one being primary speckle coming from the diffuser (namely that projected on the object) and the other being secondary speckle formed during the imaging due to the lens aperture and/or object material roughness. In order to concentrate in only one primary speckle pattern, the following condition may be considered: $\phi_L \gg \phi_D$, where $\phi_L$ is the size of the imaging lens.

Control system 16 operates to process the measured data by applying thereto a numerical algorithmic to extract the 3-D information. It should be understood that the algorithm according to the present invention, as described here, includes a novel combination of known mathematical processes. The invention utilizes this algorithm together the unique optical setup, enabling real time 3D mapping.

The algorithm used can have low computational complexity and can allow real time operation. The following is an example of an algorithmic constellation suitable to be used as part of the data processing step in the present invention.

To obtain one specific depth point, a transversal shift of its vicinity from the reference pattern needs to be found. One possible implementation of this matching is by searching for the correlation peak, which may be implemented by taking one or more windows from the image, representing the statistics/neighbourhood of the inspection point, and computing a match, e.g. correlation of such window(s) with the reference image. The windows can be taken with any amount of overlap. For each camera pixel, a depth sample could be thus obtained. The achievable depth (the 3D) resolution ($\delta Z$ along the Z-axis) varies with varying Z and depends solely on the optical setup (i.e., relative location of the laser and the camera), the speckle properties (features of the speckle pattern) and the camera resolution (which is the physical parameter of the camera).

The algorithmic approaches upon which the 3-D reconstruction may be based on image matching algorithms, from a very basic exhaustive raster search, through a more sophisticated prediction-based region growing methods, up to a higher level maximum-likelihood or other sophisticated image matching algorithms. Various approaches differ from each other in many factors: the more sophisticated approaches have much more computational complexity while producing much more accurate and less noisy data than the simple ones.

The prediction-based region-growing methods present a good tradeoff between a complexity and performance and are based on the following observation: two close points on one object are usually characterized by a small height (along Z-axis) difference between them, the so called "object continuity assumption". Hence, the Z value (depth) of a point from its neighboring points on the same region (object) can be approximately predicted. The prediction is tested and refined, and in case it is found to be adequate, the point is joined to the given region. If the prediction/refinement presents an inadequate match with the reference, this is indicative of that the Z difference is non negligible and thus the point under inspection belongs to a different region from its neighboring ("father") point.

It should also be noted that window(s) for the correlation can be either constant (e.g. 16×16 pixel window), or flowing in accordance with the local speckle/edge/object properties.

The following is an example of one possible implementation of a prediction-based region growing algorithm with a constant window size. The algorithm contains the following steps:

1) Relevance/Shadow Preparation Step.

Run over the picture (image of the object) with the resolution step (sampling points equal to M and N multiplied by the resolution, where M and N are integers) and determine whether the sampling point is a "shadow" to be marked SHADOW, or a relevant speckle window to be marked UNKNOWN. At further stages, the status of each output point is maintained, while at this first stage some points have status of UNKNOWN and others have status of SHADOW.

2) "Obtain a New Region Anchor" Step.

While the number of UNKNOWN points is more than some pre-defined percentage of the total output points, a random point is chosen that currently has the status UNKNOWN and a matching to the reference image is performed, e.g. by correlating the window $W_x \times W_y$ pixels around the chosen point with the reference image.

It should be noted that the window size $W_x \times W_y$ is subject to optimization, the tradeoffs being on the one hand the "enough statistics"/discrimination and on the other hand the complexity and small objects smearing. It should also be noted that due to geometric constraints, with a proper imaging unit/projector system calibration (i.e. when the X axis of the imaging unit is parallel to the line connecting the optical center of the imaging lens and the center of the laser spot on the diffuser), the possible lateral shifts of the speckle pattern can be limited to a rectangle which covers a few pixels, up and down from the current point and about a known fraction of width of the picture to the right and to the left from the current point (in the experimental setup shown in FIG. 1 the camera is to the right of the laser, therefore the speckle shift is to the right if the mapped object is closer than the reference, and to the left—otherwise).

Additionally, within the above geometric constraints, search is carried out for a point with a value of normalized correlation higher than a certain threshold. If none of the checked correlations reaches the threshold, a value of the best correlation is selected to check whether it passes a lower threshold: if it does, it is assumed that this is the shift of the speckle; and if it doesn't, it is understood that additional investigation is needed and the described below step 2a) is performed aimed at deciding on initiating the new region. If a point for which correlation higher than a lower threshold is found, such point is called region anchor, and the region growth is attempted around it. To grow the region, step 3) below is carried out.

2a) Decision to Grow Region.

If the match has failed, the region is further investigated by an attempt to find sufficient evidence for existence/ absence of a growable region at this position. To gather sufficient evidence, region growing step (3) is attempted, and the grown portion is decided to represent a valid region if either an anchor (a sufficiently strong point) is found within a region or a mass of consistent points are found on the region. In this way, a majority voting is performed to leave the region. In case no sufficient evidence is obtained, the region is removed and the anchor (first) point is marked as BAD, and step 2) is repeated to find a valid anchor point to grow a new region.

3) Region Growing.

The region growing is done using 4-connectivities (left/right/up/down). In the present example, the implementation of region growing is fairly simple. A FIFO (first in first out) plurality of ACTIVE points is used, where each such point (active point) has already been correlated with the reference and the correlation proved to be successful. Each time, one point from the FIFO set is fetched and its four neighbors are checked. For each neighbor which is marked as UNKNOWN, correlations of a $W_x \times W_y$ (e.g. 16×16) window to the reference are determined, where only a few possibilities are checked within a small rectangle (e.g. 5 points with offsets of (0,0) (−1,0) (1,0) (0,−1) and (0,1)) around the predicted shift of the speckle. The predicted shift is the shift of its originating ACTIVE point (called "father" class point). If there is a good correlation, the point is marked as ACTIVE and is added to the FIFO set; and if there is no good correlation, the point is marked as EDGE (its height is currently set to be equal to the height of the father point). When the FIFO is "emptied", the region edge is marked, and the process returns back to step 2) to grow a new region.

4) Region Competition.

Region competition can be implemented to considerably improve quality of region edges. One possible way which gives good results and is computationally inexpensive is to attempt growing a region not only into the UNKNOWN point space, but to any point space with depth discontinuities, e.g. belonging to a different region. The competition criterion is the correlation value, "winner takes all" per point strategy has been found to yield good results.

Based on the prediction and quick stop of the correlation procedure upon detecting bad points, the region growing algorithm provides a real-time reliable tool for depth recovery, having an excellent trade-off between its complexity and quality.

It is important to note that the larger a distance between the projection device (illuminating unit) and the projection plane (object plane), the larger the obtained speckles in the projection plane. On the other hand, the pixel size of the imaging device changes according to a different set of rules. Moreover, the speckle pattern is distorted via projection on slanted object surfaces. An (algorithmic) method to obtain correlation which is invariant to scaling and projection distortion of the speckle patterns, involves performing Mellin and logarithmic decompositions [16] of the reference speckles pattern.

The Mellin decomposition provides scale invariance:

$$f(r, \theta; x_0, y_0) = \sum_{N=-\infty}^{N=\infty} f_N(\theta; x_0, y_0) r^{i2\pi N - 1} \quad (3)$$

$$f_N(\theta; x_0, y_0) = \frac{1}{T} \int_{r_0}^{R} f(r, \theta; x_0, y_0) r^{-i2\pi N - 1} r \, dr$$

Here, $f(r, \theta; x_0, y_0)$ is the object decomposed around $x_0, y_0$ coordinates; $f_N$ is the Mellin harmonic; N is the harmonic order; $r_0$ is the minimal radius of the decomposed object; R is its maximal radius; and $T=\exp(r_0/R)$. If one harmonic is chosen, the correlation result will be scale invariant.

The logarithmic decomposition is described as follows:

$$f(x, y) = \frac{1}{2T} \sum_{N=-\infty}^{N=\infty} f_N(y)|x|^{i2\pi N - 1/2} \quad (4)$$

$$f_N(y) = \int_{-X}^{-x_0} f(x, y)(-x)^{-i2\pi N - 1/2} dx + \int_{x_0}^{X} f(x, y)x^{-i2\pi N - 1/2} dx$$

The object is not zero within the range of $|x|>x_0$ and $|x|<X$, and $T=\exp(x_0/X)$. Choosing one harmonic provides projection distortion invariance when correlating.

The speckle size changes due to the projection system and the imaging system can also be mutually compensated by means of optical setup. To understand the way this can be achieved, let us now elaborate on the details of the speckle pattern scaling.

When the illuminating beam is modeled as a Gaussian beam, the diffraction formula gives the following dependence of the beam radius W(z) on distance Z:

$$W(z) = W_0 \sqrt{1 + \frac{Z^2}{Z_R^2}} \approx W_0 \frac{Z}{Z_R}, \; z_R = \frac{\pi W_0^2}{\lambda}. \quad (5)$$

In (5), $\lambda$ is the beam wavelength, $W_0$ is the radius of the beam waist (equal to $\phi_D/2$—half of the diameter of the beam illuminating the diffuser), and $Z_R$ is the Rayleigh distance. In the approximation of (5) it is assumed that $Z \gg Z_R$.

It should be noted that a Rayleigh distance is also the distance at which the far field approximation is valid since then the quadratic phase factor in corresponding Fresnel integral is smaller than one.

It should also be noted that with the technique of the present invention, the object is preferably located at a distance L from the diffuser higher than the Rayleigh distance. It should be noted that at each Rayleigh distance from the beam waist, the beam area doubles (for diffraction-limited beams, this distance is determined by the waist radius, the refractive index, and the wavelength in the material, for imaging in the air the refractive index is approximately that of free space, i.e. 1.0).

The light intensity I at camera 14 depends on L (a distance between projector (illuminator) 12 and object 13) and on d (a distance between object 13 and camera 14), as $1/L^2 d^2$:

$$I \sim \frac{1}{L^2 d^2} \quad (6)$$

The $1/L^2$ part of the dependence (6) is due to the divergence of the projected beam carrying the speckle pattern.

It should be noted that the Gaussian beam model refers to the beam as a whole. The light beam radius W(z) increases proportional to Z, and the intensity density reduces as $1/Z^2$. As a result, the intensity of light impinging on the object is proportional to $1/L^2$. The $1/d^2$ part of the dependence (6) is due to the divergence of the coherent beam reflected from the object towards the camera.

On the other hand, a smaller portion of the speckle pattern is projected on the object (or object portion) when the object is further from the light source unit. The number of the speckle dark and light spots (speckle pattern features) falling into an interval defined by the object size is determined by the ratio of the object size s to the average speckle size $\Delta x$ of (1):

$$N \sim \frac{s}{\Delta x} \sim \frac{s}{L} \quad (7)$$

When light from the object is reflected onto the light detector, it forms there a spot of size $s_{LD}$ (i.e. $s_{LD}$ is the size of the object projection onto the photodetector plane):

$$s_{LD} = \frac{F}{d} s \quad (8)$$

Here F is the focal distance of the collecting (imaging) lens.

The average feature size projected on the photodetector is determined by ratio of (8) to (7):

$$\frac{s_{LD}}{N} \sim \frac{F}{d} L \quad (9)$$

In a preferred configuration, the diffuser plane and the detection plane (more exactly, the plane of imaging lens 14B) are located such as to provide for substantially equal L and d (the distances between the diffuser and the object and between the camera and the object).

On the other hand, the optical setup is configured so as to ensure a certain non-zero angle $\alpha$ between the axes of propagation of illuminating light incident onto the main object plane and that of light returned from there to the light detector, so as to enable triangulation based calculations. The accuracy of the 3D reconstruction will be $$\delta Z = \delta x_{LD} \frac{d}{F} \frac{1}{\tan \alpha}$$

($\delta Z$ is the 3D resolution, and $\delta x_{LD}$ is the resolution of the shift in the pixel plane obtainable by the correlation algorithm, e.g. the pixel of the camera). The angle $\alpha$ is approximately equal to L'/L, where L' is the distance between the projector and the camera.

In the experimental setup used by the inventors, the mapping system had the following parameters: L'=20 cm, L≈2 m, $\delta x_{LD}$=6 microns, and F=8 mm; thus $\delta Z$=15 mm. It is seen from the above, that the distance L' between the projector and the camera can be preselected so as to enable the mapping system to operate with a desired resolution, e.g. a few millimeters.

As indicated above, practically, the diffuser plane and the plane of lens 14B are located such as to provide for substantially equal L and d (the distances between the diffuser and the object and between the camera and the object). In order to take into account both of such requirements as L=d and a minimal distance L' from the projector to the imaging unit, a change of the speckle size on the imaging unit (camera) with changes of L and d should be considered.

The size of the speckle on the camera plane for the case that L is not equal to d is:

$$\Delta x_{cam} = \frac{\lambda F}{\phi_D} \cdot \frac{L}{d} \quad (9a)$$

In a preferred configuration, the size of the speckle on the camera plane is the same for the speckles reflected from various parts of object. The scaling of the visible speckle dimensions (i.e. on the camera plane) is suppressed if L=d. The latter condition could be guaranteed for almost the entire 3D space by placing diffuser and camera lens very close one to another, however in practice, there is a certain distance L' between the camera and the projector.

Considering that L and d are different on a fraction of the Rayleigh distance $Z_R$:

$$|L-d| \leq \epsilon Z_R. \quad (9b),$$

the size of the speckle scales with d:

$$\Delta x_{cam}(d) \approx \frac{\lambda F}{\phi_D}\left(1 + \epsilon \cdot \frac{Z_R}{d}\right) \approx \frac{\lambda F}{\phi_D} + \epsilon \cdot \frac{\phi_D F}{d} \quad (9c)$$

The matching algorithm used allows for some maximal scaling factor γ, connected to the maximal allowed visible speckle size $$\Delta x_{cam}^{max}:$$

$$\Delta x_{cam}^{max} = \frac{\lambda F}{\phi_D} \cdot (1+\gamma).$$

Hence, the difference between L and d, and consequently ε and L', are limited:

$$\epsilon \leq \frac{d}{\phi_D} \cdot \gamma \Rightarrow L' \leq \epsilon \cdot Z_R \leq \frac{d}{\phi_d} \cdot \gamma \cdot Z_R. \quad (9d)$$

As it follows from the equations (9a)-(9d), the fact that L is close to d, or, L' is bounded by equation (9d) for a given γ, will provide for the scale (average feature size) differing by at most factor of 1+γ over different portions of the speckle recorded on the imaging device. These speckle pattern portions might be reflected from objects at different positions relative to the imaging device, projected on the different regions of a 3D object surface or on differently distanced objects; in any case, the images of these portions will have substantially the same feature size (up to a factor of 1+γ) when measured in pixels of the photodetector. This average feature size will be thus substantially equal to the feature size of the reference image.

Thus, correlating an object image and a reference image using windows of the same size in both of these images is justified, since correlation as any matching operation is inherently robust towards certain distortions, depending on the speckle feature size, some amount of scaling included in this robustness. The specific parameter γ that is allowed is easily determined by any person of ordinary skill, given the specific setup parameters and the pattern properties, by considering the matching criterion over the scaled by (1+γ) and the non-scaled version of the pattern.

The correlation allows for determining shifts of the speckle pattern portions which are due to the differences between the 3D topography of an object and that of the (flat) reference plate (producing the speckle reference pattern).

The required proximity of L and d can be enabled by placing the diffuser unit and the imaging unit of the system at a distance from each other equal to a fraction ε (e.g. 0.5) of the Rayleigh distance of the illuminating light. The above described matching of the optical setup enables to obtain a scale invariance without the need to reside to other means, e.g. Mellin transform. It should be noted that speckles impinging on slanted surfaces undergo distortions mostly in the form of projections. Since the projection of the speckle in the preferred configuration of the optical setup is such as to ensure the maximally close to normal light incidence on the main object plane, and since the speckle pattern is inherently capable of withstanding a certain amount of distortion, in the preferred configuration there is no need to reside to other means, e.g. logarithmic transform.

In another preferred configuration, diffuser 12B, lens 14B and light detector 14A are configured to provide an average feature size of the imaged speckle pattern that matches the required resolution. With no need to reside to special means, the average speckle feature size is preferably of about 2 pixels. It should be understood that the average speckle feature size, $\Delta x_{cam}$, on the camera is determined by eq. (1) and (8) above, where s in eq. (8) would be Δx of eq. (1):

$$\Delta x_{cam} = \frac{F}{d} \cdot \frac{L}{\phi_D} \lambda, \text{ or considering that } L \approx d, \quad (10)$$

$$\Delta x_{cam} = \frac{F}{\phi_D} \lambda$$

Such imaging setup allows for obtaining the highest resolution, because maximum information is contained in the each pixel signal.

It should also be noted that the optical setup of the present invention allows for a large range of distances to the object. The minimal possible distance is the Rayleigh distance (e.g. 0.5 m in a specific but not limiting example used by inventors), and the maximal distance is determined by the object size and the speckle size at the object. The number of speckles projected onto the object should not be much less than the size of a correlation window divided by the average speckle feature size in pixels.

One of the properties inherent to the laser speckle is that its projection on an object yields highly contrast images. This is because a laser speckle pattern is created with high contrast, and, since laser speckle pattern propagates by way of self-regeneration, this high contrast is maintained through the depth of focus of the laser speckle pattern. High contrast images can be represented by intensities of light taking values 0 or 1 for each pixel, or this high contrast can be utilized in some other way. Thus, the high contrast property of a laser speckle pattern allows for reduction of processed data and faster image reconstruction.

It should also be noted that, as seen from the equation (2), eventually the speckle pattern is varied along the Z direction (the longitudinal axis). Thus, with the constant random reference pattern (diffuser), a set of reference images may be taken at different locations of the projection plane relative to the projection device (these images will thus be different in accordance with the longitudinal variation of the speckle pattern), and 3-D correlation may then be performed. In this case, the obtained approach allows infinite 3-D mapping range.

Reference is now made to FIGS. 3A-3B and FIGS. 4A to 4J showing several experimental results that verify the advantageous features of the invention. In these experiments, the image reconstruction was performed in real time at video rate using the set up of FIG. 1.

Figure 3A:
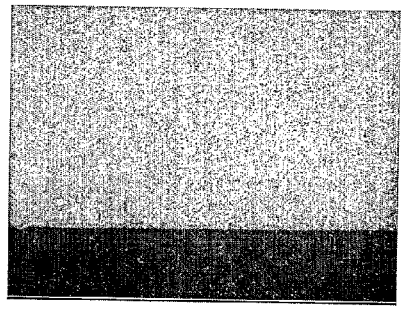
FIGS. 3A and 3B show the experimental results.
Figure 3B:
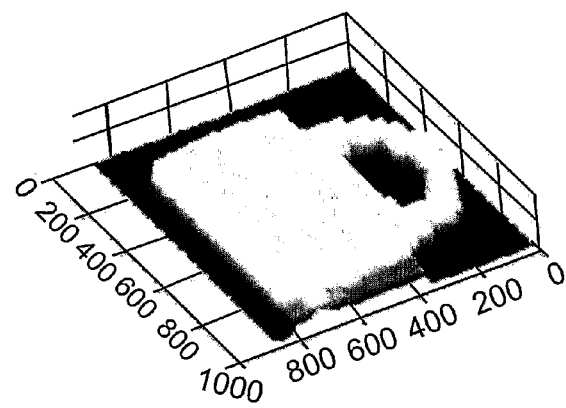

FIGS. 3A-3B exemplify reconstruction the image of a coffee cap. The illuminating unit (12 in FIG. 1) utilized a green Nd:YAG laser as the light source 12A and a piece of ground glass (diffuser) 12B to project the constant random speckles pattern. The control system was preprogrammed with a correlation algorithm utilizing a sliding window of 16×16 pixels. FIG. 3A presents a reference image (e.g., the projected speckles pattern with no object), and FIG. 3B shows a mesh of the obtained 3-D reconstruction.

Figure 4A:
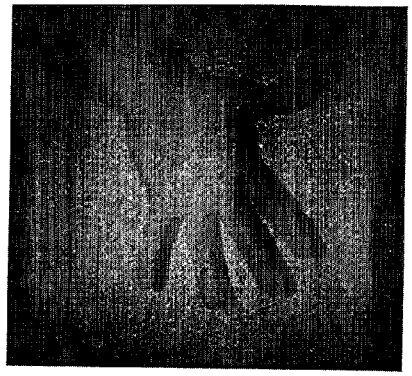
Figure 4B:

FIGS. 4A-4B exemplify 3-D mapping of a hand. FIG. 4A shows the hand with the projected speckle pattern; and FIG. 3B shows the 3-D reconstruction.

FIGS. 4C-4D illustrate the projection and mapping of a tilted plane: FIG. 4C is the plane image with the projected speckles pattern and FIG. 4D is the 3-D reconstruction. FIGS. 4E-4G show the 3-D mapping of a basket ball, where FIG. 4E is the image of a ball, FIG. 4F is the ball with the projected speckles pattern, and FIG. 4G is the 3-D reconstruction. FIGS. 4H-4J show the projection and mapping of an elephant toy: FIG. 4H is the image of the toy, FIG. 4I is the toy with the projected speckles pattern, and FIG. 4J is the 3-D reconstruction. It should be noted that different colors of the displayed reconstruction indicate the 3-D obtained information.

The present invention thus provides a novel method and system for 3-D mapping, in which a random speckles pattern is used to map the 3-D information of objects and to estimate the ranges to the certain reference plane. This technique allows for extracting highly resolved and real-time 3-D information. The 3-D information is obtained by extracting the local relative transversal shift of the random pattern in the captured image in comparison to the reference image. This technique has low computational complexity, and has no wrapping problems as exhibited in other techniques using periodic patterns projection. The optical system used is very simple.

It should be noted that the present invention is capable of improving the brightness of light detection. In this connection, the following should be noted.

Brightness level is different for objects and/or object portions being at different distances from the light source and/or the light detector. Each pixel of the light detector array acquires light from a spot of diameter $\Delta x_Z$:

$$\Delta x_Z = \frac{d}{F} \delta x, \quad (11)$$

where $\delta x$ is the pixel size.

The brightness of the detected speckle pattern is determined by the intensity of a signal reaching a single pixel of the light detector:

$$I_P \sim I \cdot \frac{\Delta x_Z^2}{s^2} \cdot \frac{D^2}{d^2} \sim \frac{1}{L^2} \quad (12)$$

where D is the diameter of the imaging lens and it is related to the spherical angle in Str, at which the radiation is reflected from the object.

As can be seen from eq. 12, the brightness level received at the detector is proportional to $1/L^2$, therefore close object regions and far object regions will be seen by the detector with different brightness levels, depending on the distance, thus affecting the 3D-reconstruction performance. An additional factor is the reflection coefficient (albedo) difference between different regions of the object.

The control system can identify light spots in the speckle pattern by comparing their brightness levels with a predetermined threshold. However, such an algorithm will identify more light spots for objects (or object portions) situated closer to the light source. Also, the light spots will have larger areas and also different shapes for objects situated closer to the light source. On one hand, this effect can be utilized for 3D-reconstruction and range determination. On the other hand, this effect is preferably taken into account during or prior to the correlation procedure.

Figure 5:
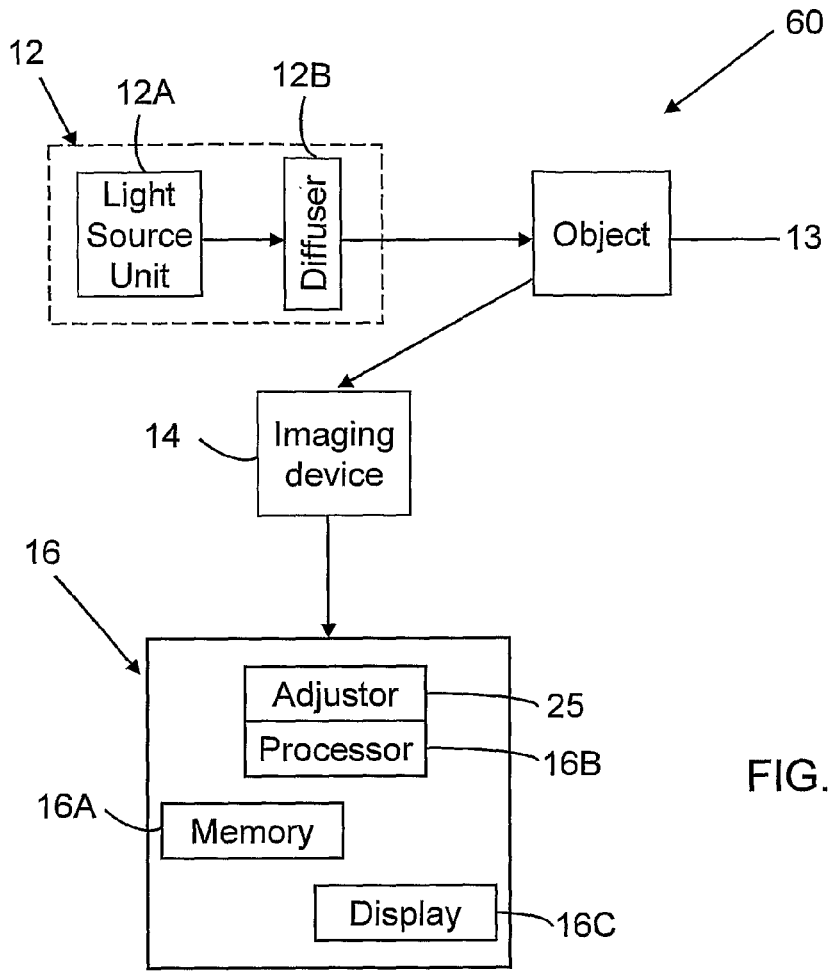
FIGS. 5, 6A-6B and 7 schematically illustrate various examples of a system of the invention utilizing a brightness adjustor.

Referring to FIG. 5, there is shown, by way of a block diagram, another example of a mapping system 60 of the invention. To facilitate understanding, the same reference numbers are used for identifying components that are common in all the examples of the invention. System 60 includes an illuminating unit 12 configured for projecting a laser random speckle pattern onto an object 13, an imaging device 14, and a brightness controller (adjustor) 25. The latter is configured for controlling the variation of the brightness in the field of view of the camera or perceivance of this variation by the system. Adjustor 25 constitutes a mechanism of increasing the mappable range. It should be understood, that more than one adjustor may be used in the mapping system.

In the example of FIG. 5, adjustor 25 is implemented as a sub-utility within the data processing and analyzing utility 16B of the control unit. Such a sub-utility may perform the above described Mellin transformation.

In some embodiments, brightness adjustor 25 is configured for reducing the illumination brightness variation between different regions of the field of view of the camera and can be implemented as an optical unit arranged to be anywhere in the light propagation path. For example, the adjustor can be implemented as an optical unit and may be integrated with light source unit 12A or diffuser 12B, or can be a separate unit arranged in the illumination path downstream of diffuser 12B, or in between light source unit 12A and diffuser 12B.

Likewise, adjustor 25 can be implemented as an analog processing unit located between the light detector and the control unit, or being a part of light detector 14A or a part of control system 16. In one example the brightness level is controlled by local adjustment of automatic gain control (AGC), i.e. by control of the amplification of the analog readout at each pixel or group of pixels. This allows for receiving digital images having more uniform brightness level; thus allowing for extending the mappable range with the light detector having a certain fixed dynamic range.

Adjustor 25 is configured for controlling the brightness level (being an optical processor or a digital processor) or controlling the representation of the brightness level (being associated with the detector output). For example, adjustor 25, configured as an optical processor, can perform an optical coordinate transformation prior to the digital sampling. Such an optical coordinate transformation may contain a step of transforming the Cartesian (x,y) coordinates into polar-like (log r, θ) coordinates by using the Saddle point integration technique or multi facet approaches [e.g. Zeev Zalevsky, David Mendlovic "Optical implementation of the Bode transform", Applied Optics, Vol. 34, Issue 5, pp. 828-(February 1995)].

The following are some specific but not limiting examples of the optical mapping system configured and operable according to the invention.

Figure 6A:
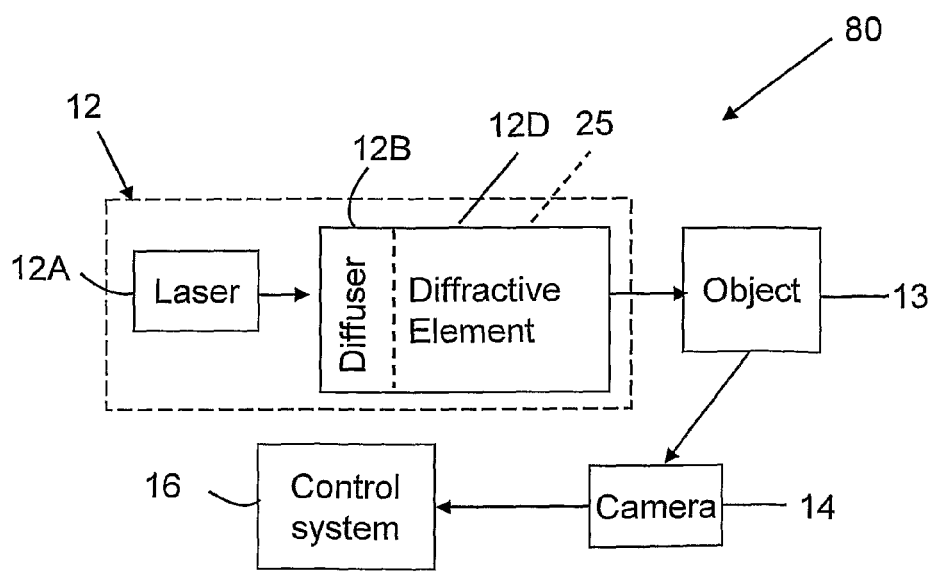

FIG. 6A exemplifies a mapping system 80 in which a diffractive element 12D is accommodated in the optical path of speckle pattern propagating towards the object. Diffractive optical element can be configured as an adjustor 25 implementing reduction of contrast (relative brightness) for planes differently distanced from the light source. In the present example, adjustor 25 is incorporated in or attached to the diffuser. Adjustor 25 is configured to produce a non diffractive beam (in the longitudinal range) of a decreased beam divergence. This may be implemented e.g. by combining special semi random diffractive optical element having random distribution along the radial axis and symmetry along the angular axis (having rings structure) and an Axicon (not shown) attached thereto which is a cone like element providing extended depth of focus for random pattern generators. It should be noted, that even without the Axicon such a ring based diffuser can extend the depth of focusing.

Figure 6B:
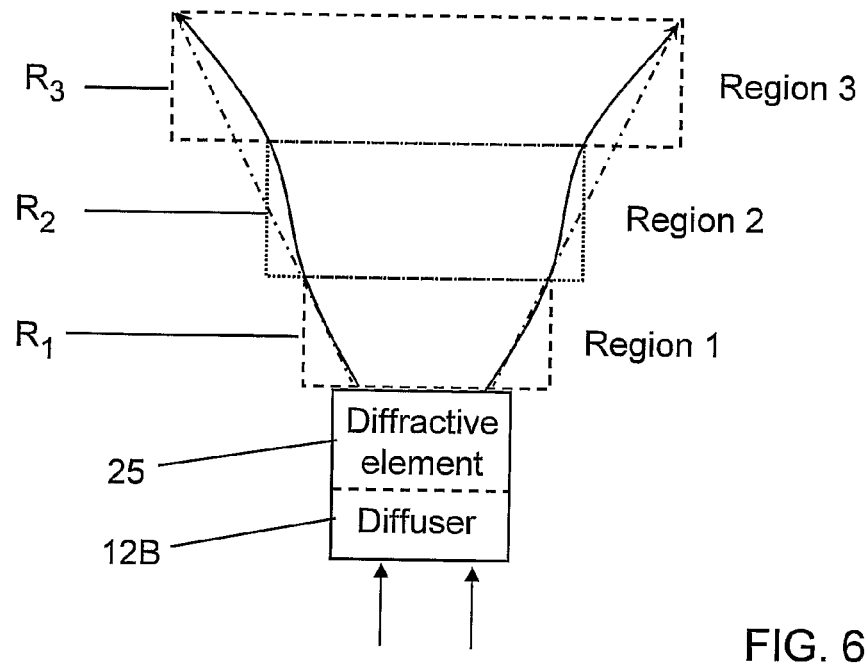

FIG. 6B schematically shows the operational principles of such a cone-like diffractive element 25. Element 25 is located close to a diffuser 12B (e.g. attached to the diffuser), and is configured and operable for producing the non-diffractive beam for the beam spot, while allowing the speckles appearance inside the spot. As a result of the light passage through element 25, three different successive regions are created: a light propagation region $R_1$ being a regular diffraction region, a light propagation region $R_2$ being the volume of interest where the target may appear, and a light propagation region $R_3$ being again a region where the regular diffraction is obtained. Considering the typical Axicon operation, since the object is placed in region $R_2$, the reflected light will fulfill the regular diffraction laws as appears in region $R_3$. The cross section can be considered similar to two prisms attached back to back; hence, the beams illuminating the cross-sectional region are redirected towards the center where interference occurs and non diffractive beam is formed. Diffractive element 25 provides for a smaller divergence of a laser speckle pattern carrying beam within region $R_2$. Thus, the light intensity will vary slower with a distance L from the light source than that of equation (12) above. This makes the brightness level less dependent on the distance from the light source and thus more uniform.

It should be noted, that in the example of FIG. 6A, diffractive optical element 12D can be configured to perform various functions, including the brightness adjustment or not. If the diffractive optical element (DOE) is located close (up to a physical contact) to the diffuser, after the diffuser in the laser beam optical path, the light field in the far field will be a convolution between the speckle far field distribution and the Fourier Transform of the DOE. Thus, various functions (e.g. speckle shaping) can be achieved with the optical setup of FIG. 6A. Another approach provides the 3-D mapping resolution allowing separation of segments of $\Delta z$ along the Z axis. In case the observed object has variations along the Z axis which are larger than the mapping resolution $\Delta z$, distortions occur (e.g. for a tilted plane as an object). Those distortions occur mainly since the region for the reference search is significantly shifted aside. The distortions can be identified by shearing distortions of the object. To this end, shaping of the speckles can be used. If for instance the speckles have elliptic shape, then shearing distortions can be detected according to the variation in the original speckle shape. The diffractive optical element 12D used in this setup is a phase only element such that its Fourier transform produces for example an elliptic cross section of intensity (e.g. a tilted line). Such a DOE can for example be designed based on the technique disclosed in the following publication: Z. Zalevsky, D. Mendlovic and R. G. Dorsch, "The Gerchberg-Saxton Algorithm Applied in the Fractional Fourier or the Fresnel Domains," Opt. Let. 21, 842-844 (1996); or other known methods can be used.

Figure 7:
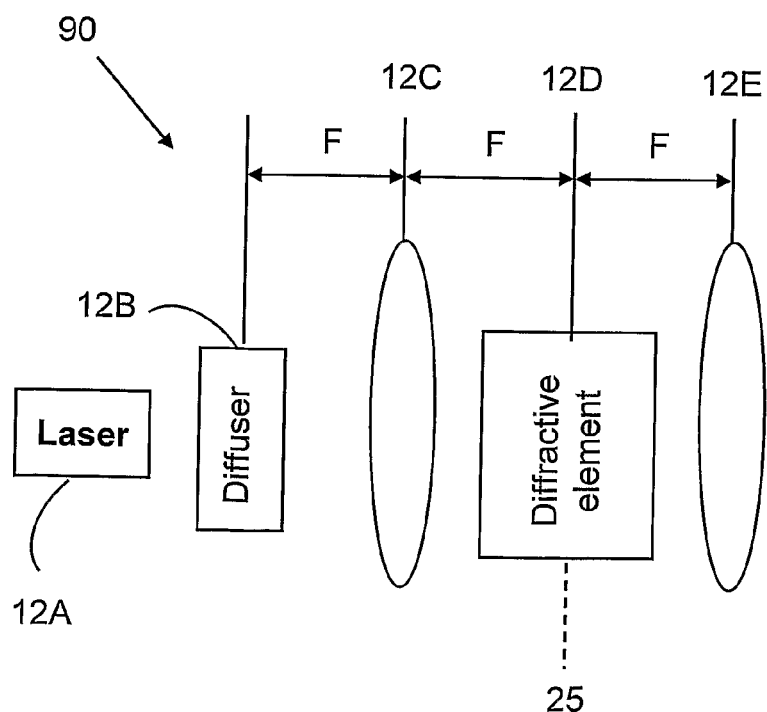

Reference is made to FIG. 7, showing another example of a projection module 90 suitable to be used in a mapping system of the invention. Setup 90 includes a laser source 12A, a diffuser 12B, a first converging lens 12C, a diffractive optical element 12D, and a second converging lens 12E. The elements are arranged as the so-called "4-F Fourier Transformer": diffuser 12B is in the back focal plane of lens 12C, diffraction element 12D is in the front focal plane of lens 12C and in the back focal plane of lens 12E, and the focal lengths of the lenses are equal. Lens 12C applies the Fourier transform of the speckle pattern generated by diffuser 12B; at the diffraction element, its transmission function is multiplied with the Fourier transform of the speckle pattern; and lens 12E produces the inverse Fourier of the product function resulting from multiplication. Thus, in the far field approximation (Z is larger than the Rayleigh distance) where the object is placed, the speckle random distribution is multiplied with the element 12D.

In one example, element 12D can be implemented as an intensity equalization mask: an amplitude mask, which transparency function is selected so as to provide a predetermined light intensity in the far field. For example, element 12D can be a mask that is more transparent at its periphery regions than in its center. The projected light will be determined by the mask transparency and the speckle pattern. This way, the light intensity distribution can be made significantly more uniform in the transversal plane. To summarize, this element can contribute in the equalizing of the energetic distribution of the projected speckle pattern Thus, the present invention provides an effective 3-D object reconstruction technique using a simple and cheap optical setup based on the principles of triangulation. The invention can use only a single image; can operate with the single stationary mounted camera; and allows for a large range of possible distances to an object.

The invention claimed is:

1. A system for object reconstruction, comprising:
   an illuminating unit, comprising a coherent light source and a generator of a non-periodic pattern comprising a diffractive optical element (DOE) in an optical path of illuminating light propagating from the light source toward an object, thereby projecting the non-periodic pattern onto an object;
   an imaging unit configured to detect a light response of an illuminated region and generating image data indicative of the object within the projected pattern; and
   a processor, configured to reconstruct a three-dimensional (3D) map of the object responsively to a shift of the pattern in the image data relative to a reference image of the pattern.

2. The system according to claim 1, wherein the reference image is acquired at a reference plane oriented normally to the optical path of the illuminating light.

3. The system according to claim 2, wherein the reference plane is at the same distance from the generator of the non-periodic pattern and from the imaging unit.

4. The system according to claim 1, wherein the processor is configured to reconstruct the 3D map by determining a correlation between the image data and the reference image.

5. The system according to claim 1, wherein the DOE is configured to adjust a brightness variation of the projected pattern between different regions in a field of view of the imaging unit.

6. The system according to claim 1, wherein the projected pattern comprises a Fourier transform of the DOE.

7. The system according to claim 1, wherein the imaging unit comprises a single light detector having a stationary field of view.

8. A method for object reconstruction, comprising:
projecting onto an object a non-periodic pattern formed by a coherent light source and a generator of the non-periodic pattern comprising a diffractive optical element (DOE) in an optical path of illuminating light propagating from the light source toward the object;
detecting a light response of an illuminated region and generating image data indicative of the object within the projected pattern; and
processing the image data so as to reconstruct a three-dimensional (3D) map of the object responsively to a shift of the pattern in the image data relative to a reference image of the pattern.

9. The method according to claim 8, wherein the reference image is acquired at a reference plane oriented normally to the optical path of the illuminating light.

10. The method according to claim 9, wherein the reference plane is at the same distance from the generator of the non-periodic pattern and from an imaging unit that detects the light response.

11. The method according to claim 8, wherein processing the image data comprises reconstructing the 3D map by determining a correlation between the image data and the reference image.

12. The method according to claim 8, wherein the DOE is configured to adjust a brightness variation of the projected pattern between different regions in a field of view of the imaging unit.

13. The method according to claim 8, wherein the projected pattern comprises a Fourier transform of the DOE.

14. The method according to claim 8, wherein detecting the light response comprises capturing an image using a single light detector having a stationary field of view.

* * * * *